United States Patent
Jeong et al.

(10) Patent No.: US 7,385,850 B2
(45) Date of Patent: Jun. 10, 2008

(54) METHOD OF PROGRAMMING AND VERIFYING CELLS OF A NONVOLATILE MEMORY AND RELATIVE NAND FLASH MEMORY

(75) Inventors: Kuhong Jeong, Yongin (KR); Hyungsang Lee, Seongnam-Si (KR); Jacopo Mulatti, Latisana (IT)

(73) Assignees: STMicroelectronics S.r.l., Agrate Brianza (MI) (IT); STMicroelectronics Asia Pacific Pte Ltd, Singapore (SG); Hynix Semiconductor Inc., Kyoungki-Do (KR)

( * ) Notice: Subject to any disclaimer, the term of this patent is extended or adjusted under 35 U.S.C. 154(b) by 72 days.

(21) Appl. No.: 11/539,708

(22) Filed: Oct. 9, 2006

(65) Prior Publication Data

US 2007/0109866 A1 May 17, 2007

(30) Foreign Application Priority Data

Oct. 10, 2005 (EP) ................................. 05425712

(51) Int. Cl.
*G11C 11/34* (2006.01)
*G11C 7/10* (2006.01)

(52) U.S. Cl. .................... 365/185.22; 365/185.09; 365/185.12; 365/189.05; 365/200

(58) Field of Classification Search ............ 365/185.09, 365/185.22
See application file for complete search history.

(56) References Cited

U.S. PATENT DOCUMENTS

| | | | | |
|---|---|---|---|---|
| 5,299,162 A | * | 3/1994 | Kim et al. ............... | 365/185.17 |
| 5,526,307 A | * | 6/1996 | Yiu et al. ............... | 365/185.01 |
| 6,005,810 A | * | 12/1999 | Wu ........................ | 365/185.33 |
| 6,282,121 B1 | | 8/2001 | Cho et al. ............... | 365/185.22 |
| 6,490,697 B1 | * | 12/2002 | Machida et al. ........ | 714/42 |
| 6,549,478 B2 | * | 4/2003 | Suzuki .................... | 365/201 |
| 6,970,382 B2 | * | 11/2005 | Toros et al. ............ | 365/185.22 |
| 2001/0017789 A1 | * | 8/2001 | Noda ....................... | 365/185.12 |
| 2001/0050377 A1 | | 12/2001 | Ikehashi et al. ......... | 257/200 |
| 2003/0048667 A1 | * | 3/2003 | Mori et al. ............. | 365/185.33 |
| 2003/0133340 A1 | | 7/2003 | Lee ........................ | 365/200 |
| 2004/0117723 A1 | * | 6/2004 | Foss ....................... | 714/805 |
| 2004/0240268 A1 | | 12/2004 | Kim et al. .............. | 365/185.09 |
| 2005/0162918 A1 | | 7/2005 | Kim et al. .............. | 365/185.22 |

* cited by examiner

*Primary Examiner*—Ly D Pham
(74) *Attorney, Agent, or Firm*—Lisa K. Jorgenson; Allen, Dyer, Doppelt, Milbrath & Gilchrist, P.A.

(57) ABSTRACT

A method of programming cells in a nonvolatile memory is based upon a Global Verify operation and a Byte-by-byte Verify operation. The cells of a destination page of the nonvolatile memory are programmed, and logic values stored in the programmed cells of a source page of the same memory are verified that they have been correctly copied into corresponding cells of the destination page. The method carries out the fast but inadequate-at-times Global Verify operation, and if the Global Verify operation fails for a certain number of attempts, the Byte-by-byte Verify operation is carried out, which is slower but accurate.

20 Claims, 5 Drawing Sheets

METHOD OF PROGRAMMING AND VERIFYING CELLS OF A NONVOLATILE MEMORY AND RELATIVE NAND FLASH MEMORY

FIELD OF THE INVENTION

The invention relates to memory devices, and more particularly, to a method of copying programmed cells of a source page of a nonvolatile memory into corresponding cells of a destination page and verifying whether logic values stored in the programmed cells have been correctly copied into the cells of the destination page, and a corresponding NAND FLASH memory.

BACKGROUND OF THE INVENTION

There is an increasing demand for electrically programmable and erasable nonvolatile semiconductor memory devices NAND type FLASH memory devices are memory devices capable of storing a large amount of data. These high-integration devices substantially comprise a plurality of memory cells connected in series to form a plurality of series of cells that form a memory array of cells.

Each cell has a current path between respective source and drain regions of the cell formed in a semiconductor substrate. A floating gate functionally overhangs the channel region between the source and drain regions, and a control gate is capacitively coupled to the floating gate.

FLASH memory cells are programmed by connecting a source region of the cell and the semiconductor substrate, i.e., a bulk region, to a node at ground potential, and applying a relatively high voltage (program voltage) ranging for example from 15V to 20V to the control gate. Also, a voltage ranging for example from 5 to 6V is applied to the drain of the memory cell to generate hot charge carriers. The hot charge carriers supplied by the drain region (electrons) are gathered and accumulated in the floating gate because of the intense electric field created by the high voltage applied to the control gate.

The erase operation for programmed FLASH memory cells is performed simultaneously on all the programmed cells of a certain sector of the whole array of cells. The same bulk region is shared, and the erase operation comprises applying a relatively high negative voltage (erase voltage) for example −10V to the control gate. A positive voltage for example 5V is applied to the bulk region to determine conditions for the Fowler-Nordheim (F-N) tunneling effect that causes the electrons accumulated on the floating gate of a programmed cell to discharge toward the source region. The erase threshold voltage of present FLASH memory cells typically ranges from 1V to 3V.

In general, the above described program or erase operations are repeated a plurality of times on a same cell for progressively charging or discharging its floating gate, respectively. At each step, the state of the cell is verified and a further program or erase step is carried out or not depending on whether the cell is correctly programmed or erased.

The memory cell, the threshold voltage of which was increased by one or a succession of program steps, is nonconductive (OFF) because current is prevented from flowing from the drain region to the source region. The memory cell, the threshold voltage of which was lowered by one or a succession of erase steps is conductive (ON) because current may flow from the drain region to the source region.

Typically, in FLASH memory devices the whole storage space is organized in pages. Each page substantially comprises an array (or sub-array) of addressable cells. Such an organization and the presence of a buffer page register allows all the cells of a page to be programmed or erased simultaneously.

Each page has a respective bank of redundancy cells for substituting cells found to be defective in an EWS testing phase of the memory device being fabricated. During this testing phase fuses are burned for redirecting the address of a memory location containing a failed cell to a certain redundancy column of cells, thus substituting the column of cells containing failed cells.

A Copyback Program in nonvolatile memory devices is an important function for quickly and efficiently rewriting data stored in a page (source page) to another page (destination page). An internal buffer register is used for temporarily storing data read from the source page.

The general procedure of a Copyback Program is shown in FIG. 1 and includes the following operations.

1) Data is read from a Source Page and is stored in an internal register;

2) Data stored in the internal register is programmed into a destination page, and a Program-Verify operation is carried out; and 3) A Pass/Fail check is performed In case of a fail, step 2) is carried out again, otherwise the Copyback Program is finished.

In the ensuing description reference is made to NAND FLASH memory devices, though the same considerations hold for any kind of nonvolatile memory device that contemplates a Copyback Program operation, such as a NOR FLASH memory, etc.

A sample timing diagram of the main signals of a NAND FLASH memory during a Copyback Program operation is depicted in FIG. 2. The meaning of each label is provided in TABLE 1:

TABLE 1

| | |
|---|---|
| CLE | Command Latch Enable |
| $\overline{CE}$ | Chip Enable |
| $\overline{WE}$ | Write Enable |
| ALE | Address Latch Enable |
| $\overline{RE}$ | Read Enable |
| I/O$_{0-7}$ | Data Input/Outputs |
| R/$\overline{B}$ | Ready/Busy |
| $t_{WC}$ | Write Cycle Time |
| $t_{WB}$ | $\overline{WE}$ High to Busy |
| $t_R$ | Data Transfer from Cell to register |
| $t_{PROG}$ | Program Time |

As shown in FIG. 2, a Copyback Program operation is a sequence of Page-Read operations at the Source Page Address and Copying Program operations at the Destination Page Address. After the Copying Program operation is completed, the Program Verify operation is carried out, and a pass/fail flag is generated for signaling whether the Copyback Program operation is successfully completed or not.

If the Destination Page has a cell that needs higher programming voltages to be programmed than the other cells, a fail may be flagged in the first programming attempt. In this case, the program operation is performed again by increasing the programming voltage.

There are two operations of cell verification in nonvolatile memory devices: 1) Global Verify operation; and 2) Byte-by-byte Verify operation. Global Verify operation is a very fast method for verifying programmed cells. To better understand how it works, reference is directed to FIG. 3 illustrating a NAND memory with a page buffer. The meaning of each label is provided in TABLE 2.

TABLE 2

| | |
|---|---|
| DSL | Drain Select Line |
| WL | Wordline |
| SSL | Source Select Line |
| BLe | output of an even bitline |
| BLo | output of an odd bitline |
| VIRPWR | Virtual power |
| DISCHe | control signal for discharging the output of the even bitline |
| DISCHo | control signal for discharging the output of the odd bitline |
| BSLe | selection signal of the even bitline |
| BSLo | selection signal of the odd bitline |
| PRECH_N | pre-charge signal |
| SO | sense out |
| PGM | program control signal |
| QB | latched data stored in the selected cell |
| PBDO | page buffer data output control signal |
| MLCH | main latch signal |
| MRST | reset signal |
| nWDO | bitline fail flag |

If a 0 is to be stored in the selected cell (programmed cell), the latched datum QB is 0. When verifying the cell, if the selected cell results in being programmed (0), the cell is in an off state, the signal BLe is logically active. Therefore, the latched datum QB becomes logically active when a pulse MLCH is generated. In this situation, the bitline fail flag nWDO remains floating.

If a 1 is to be stored in the selected cell (erased cell), the latched datum QB is 1. When verifying the cell, if the selected cell results in being erased, the cell is in an on state. The signal BLe is logically active and QB remains logically active (1). Also in this case, the bitline fail flag nWDO remains floating.

A general pass/fail flag of the Global Verify operation is generated by the circuit of FIG. 4 that logically combines all the bitline pass/fail flags corresponding to the nWDO signals If all the cells selected for storing a 0 are programmed successfully, all nWDO signals will be floating. Thus, when the logic signal CHECK switches active, the global pass/fail flag PASS assumes a high logic value.

Otherwise, if a cell selected to be programmed remains conductive (erased), then the BLe signal is logically null. Therefore, when the MLCH pulse is generated, the latched datum QB remains null and the nWDO flag is logically high. If at least one flag nWDO is high, the global pass/fail flag PASS is low, signaling that the global program operation has failed. In a Global Verify operation all nWDO flags are combined together simultaneously for generating a global pass/fail flag.

The other verification operation is the Byte-by-byte Verify (or Word-by-word Verify in a 16× mode) is an accurate but relatively long operation because the cells are verified Byte-by-byte (or Word-by-word) by sequentially incrementing the column address in the corresponding page. The Byte-by-byte Verify operation starts with the first column address and is repeated for all column addresses up to the last column address. Generally, the Byte-by-byte Verify operation is used only for verifying erased cells and is carried out by dedicated Erase-Verify circuits included in every NAND memory device.

A typical scheme of a NAND memory with a page buffer and with redundancy redirect is depicted in FIG. 5. A pass-gate controlled by the signal YA/YB transfers the latched datum to a multiplexer of a bank of multiplexers when the grounding command DL_DIS is null.

As depicted in FIG. 6, each multiplexer is input with signals DL corresponding to latched data, and with corresponding signals generated by a bitline of a redundancy register corresponding to the addressed bitline. Each multiplexer generates a bitline pass/fail flag DL_O as a replica of a signal DL or of its corresponding signal generated by a redundancy bitline depending on whether redundancy is enabled or not.

The circuit of FIG. 7 generates a global pass/fail flag E_PASSFAIL by logically combining all bitline pass/fail flags DL_O. When verifying the selected cell, the latch, highlighted by a surrounding dash-line perimeter, transfers DL0 to a PASS/FAIL check circuit. The PASS/FAIL check circuit evaluates each DL_O signals by byte (or word). Therefore, it is possible to verify only one byte (or word) at the time. To verify the next byte (or word), the column address is again sequentially incremented until the last column address of the byte (or word) is reached.

The Byte-by-byte Verify operation takes a long time if it is carried out on the whole memory, but provides an accurate verification of the state of the cells Generally, it is not possible to employ the Byte-by-byte Verify operation for Program Verify because of strict timing specifications that are commonly imposed for performing a pre-established maximum number of Program Verify operations.

For example, suppose that the maximum program time in conventional NAND FLASH memory specification is 700 µs, and the maximum number of program attempts is 12. When executing the Global Verify operation after each attempt, the maximum program time for 12 attempts is about 620 µs. This comfortably meets the specifications.

Should a Byte-by-byte Verify operation be performed instead of a Global Verify operation after each attempt, the program time for 12 attempts would be about 1200 µs. This is well beyond the maximum time allowed by the specifications This explains why Byte-by-byte Verify is not adopted for carrying out Program Verify operations, and why a Global Verify operation is normally used.

For various reasons, there may be defective cells in a finished memory device. A defective cell can be a short-type defective cell or an open-type defective cell. In a short-type defective cell, the datum stored therein is always 1. That is, the cell always results as an erased cell and cannot be programmed. In an open-type defective cell, the stored datum is always 0. That is, the cell is always seen as a programmed cell and cannot be erased.

An example of an open-type defective cell is a cell in which the drain region is disconnected. A short-type defective cell may be a cell affected by an excessive leakage, or its drain region is shorted to ground.

Finished NAND FLASH memory devices are tested once more and are either marked as good or discarded depending on the test results. Generally, memory devices are discarded if they need more than a certain number M of program attempts to be correctly programmed.

When the Program-Verify operation is carried out in a Copyback Program mode, sometimes the global pass/fail flag PASS always signals a fail. This is notwithstanding the fact that the programmed cells in the destination page pass a Read test.

It has been statistically determined that this inconvenience occurs when the Copyback Program operation is executed from an odd to an even page, or vice versa. For this reason, certain manufacturers enable the Copyback Program operation only from an odd to an odd page or from an even to an even page. This type of safeguard significantly limits the way the whole memory space can be exploited.

SUMMARY OF THE INVENTION

In view of the foregoing background, the global pass/fail flag PASS may signal a fail when a source cell is an open-type defective cell, and by coincidence, the destination cell is a short-type defective cell, as schematically illustrated in FIG. 8. In this situation, the bitline pass/fail flag nWDO of the bitline containing the defective cell is not floating.

This uncertainty derives from the fact that the Global Verify operation does not involve eventual redundancy bitlines even if a redundancy cell that substitutes a corresponding cell of a source page is correctly copied into the redundancy cell that substitutes a corresponding cell of the destination page. This explains why the Program Verify test fails while the Read test does not.

Even if each defective cell has been replaced by a corresponding redundancy cell and the Copyback Program operation is successfully accomplished, a memory device may still be discarded without reason because of the Global Verify operation failing.

With the Byte-by-byte Verify operation, if a failed bitline has been substituted with a redundancy bitline, it is possible to verify the substituted redundance bitline instead of the failed bitline, though timing specifications must be met.

Another aspect of the invention is directed to a method for programming cells of a destination page of a nonvolatile memory and verifying whether logic values stored in programmed cells of a source page of the same memory have been correctly copied into corresponding cells of the destination page Both the fast but inadequate-at-times Global Verify operation, and if the Global Verify operation fails, the Byte-by-byte Verify operation, which is slower but accurate are exploited. During the Copyback operation, a conventional Global Verify operation is executed. If the attempts to program a cell reaches a pre-established maximum N, the Byte-by-byte Verify operation is used to check if the memory page contains a defective cell.

When using the Byte-by-byte Verify, the data output from all the cells of the page, including the substituted redundancy cells, are read and verified by increasing an internal column address. In case a defective cell is substituted by a redundancy cell, the Byte-by-byte Verify operation checks the logic content of the redundancy cell, not of the substituted failed defective cell, thus overcoming the above mentioned problem.

Moreover, the method of performing the Copyback Program operation does not impose any odd-to-odd or even-to-even restriction, and therefore, the Copyback Program operation may be carried out also from even to odd pages or vice versa.

The method may be conveniently implemented in a NAND FLASH memory including a logic circuit for counting the number of times the Global Verify operation is carried out consecutively, and for activating the Erase-Verify circuit that implements the Byte-by-byte Verify operation, normally used only for verifying erased cells, when the count reaches the pre-established maximum N.

BRIEF DESCRIPTION OF THE DRAWINGS

The invention will be described referring to the attached drawings, wherein.

DETAILED DESCRIPTION OF THE PREFERRED EMBODIMENTS

Figure 1:
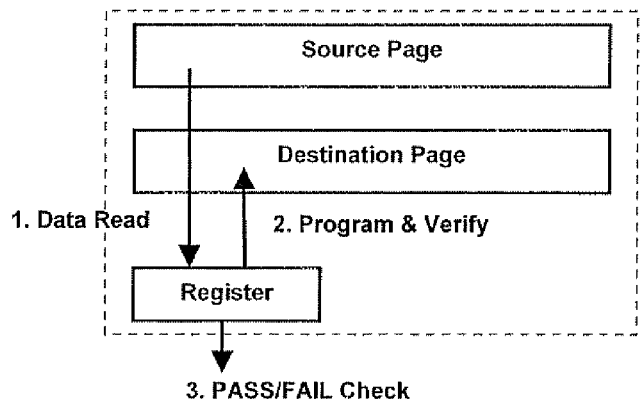
FIG. 1 is a basic scheme illustrating the Program Verify operation in FLASH memory devices in accordance with the prior art.
Figure 3:
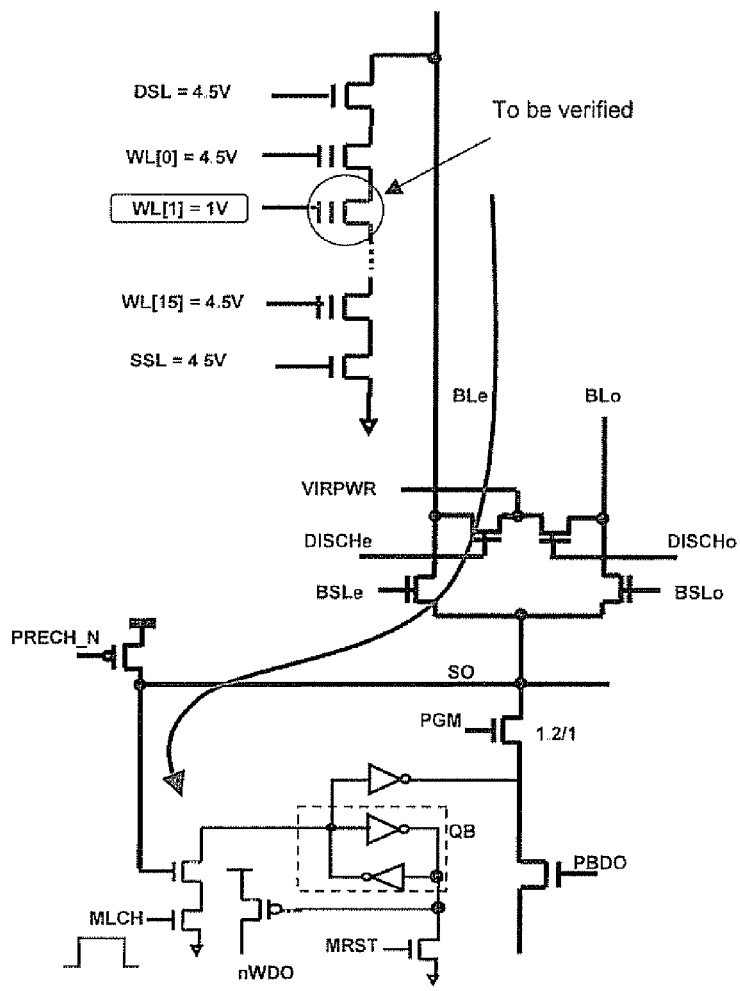
FIG. 3 depicts a NAND FLASH memory with a buffer for storing a read bit in accordance with the prior art.
Figure 2:
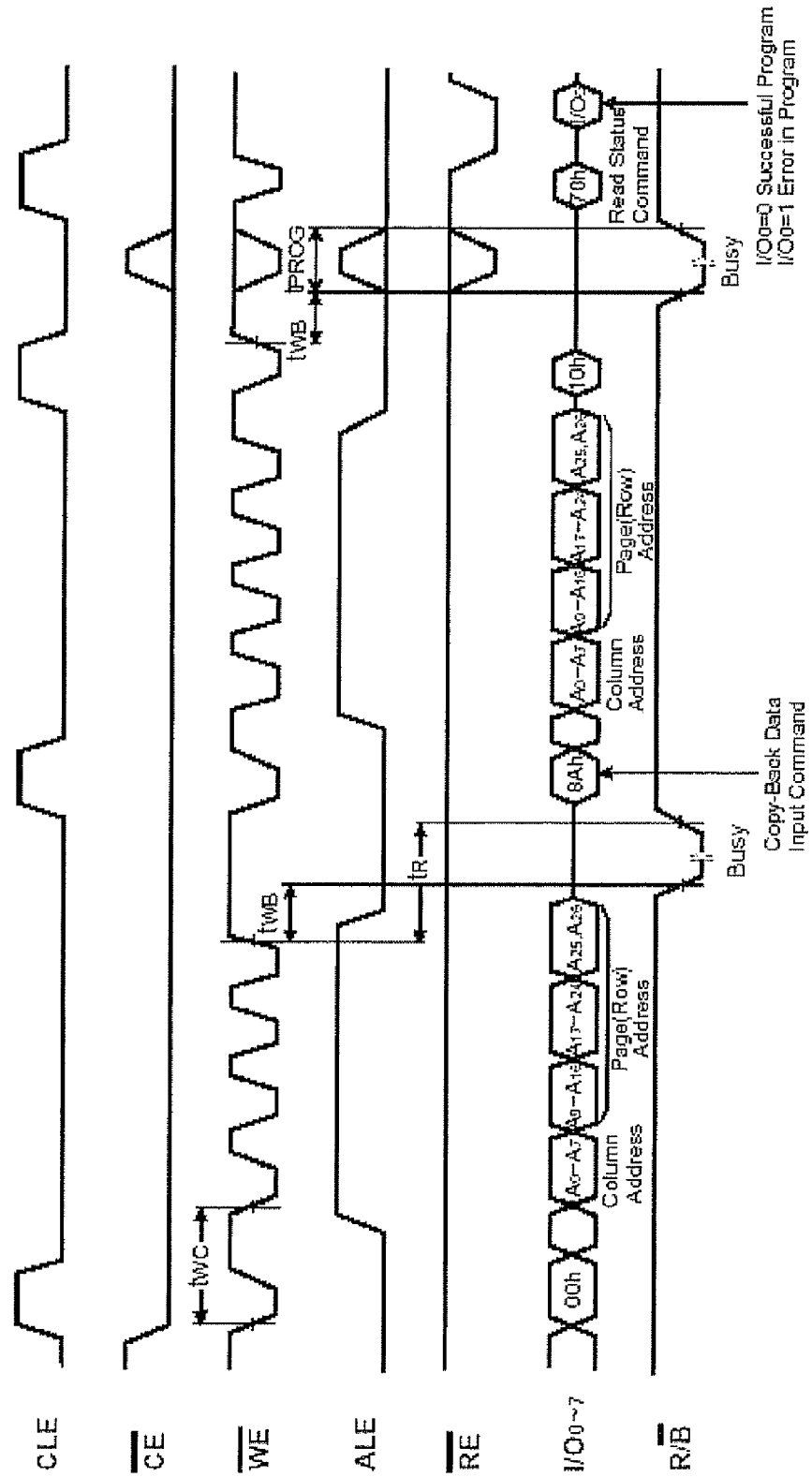
FIG. 2 is a sample timing diagram of the main signals of a FLASH memory device in accordance with the prior art.
Figure 4:
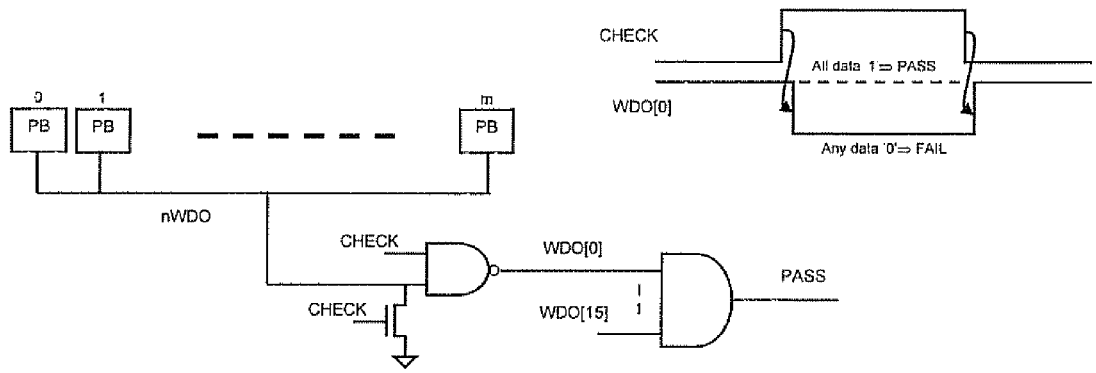
FIG. 4 shows a logic circuit for generating the pass/fail flag for a Global Verify operation in accordance with the prior art.
Figure 5:
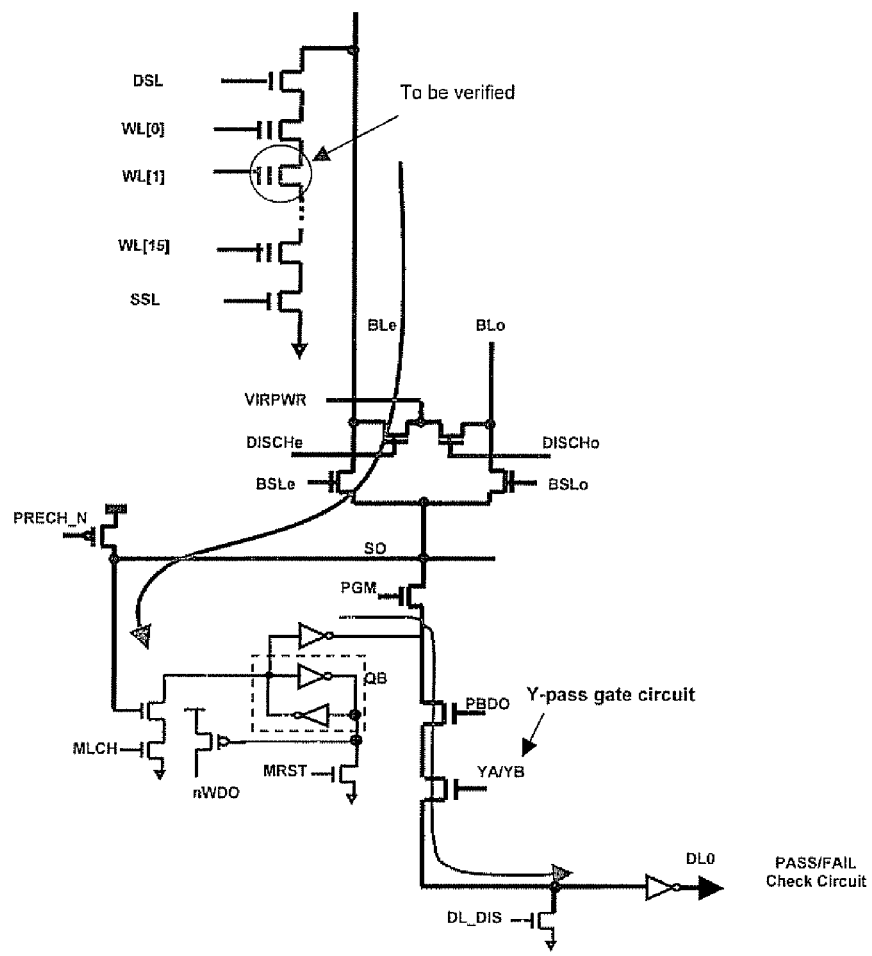
FIG. 5 depicts a NAND FLASH memory with a buffer for storing a read bit and a circuit for byte-by-byte verification in accordance with the prior art.
Figure 6:
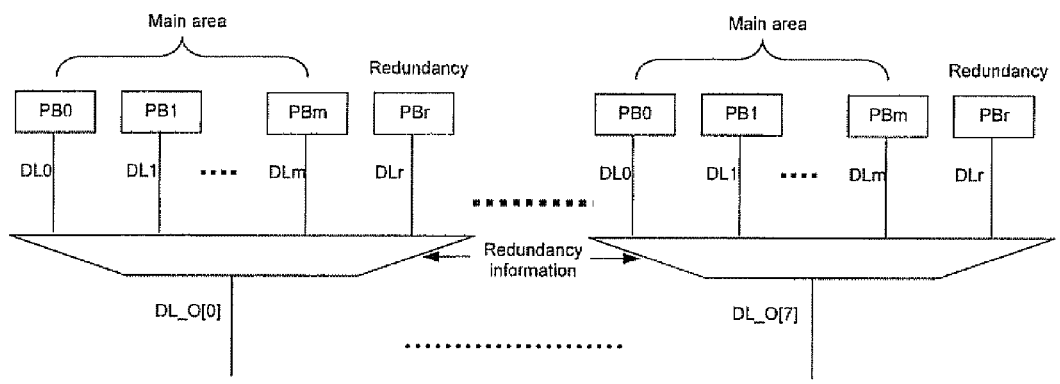
FIG. 6 is a detailed view of the multiplexers of the circuit for byte-by-byte verification of FIG. 5.
Figure 7:
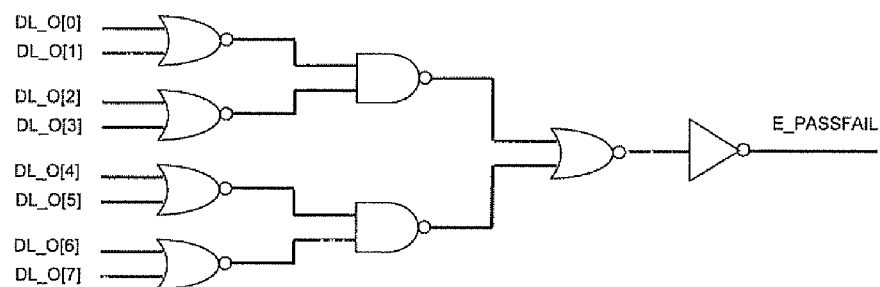
FIG. 7 shows a logic circuit for generating the pass/fail flag for a Byte-by-byte Verify operation in accordance with the prior art.

According to the method of the invention, cells are verified with a Global Verify operation for a maximum consecutive number of times N, then the Byte-by-byte Verify operation is carried out. When the Global Verify operation is performed, all cells are verified in parallel Thus, the Global Verify is passed only if all nWDO signals, including those associated to cells of the redundancy area, are floating. If this does not happen, a Byte-by-byte Verify operation is carried out. This last operation does not involve the nWDO signals, but the digital signals DL that are input to the multiplexers depicted in FIG. 6.

Figure 8:
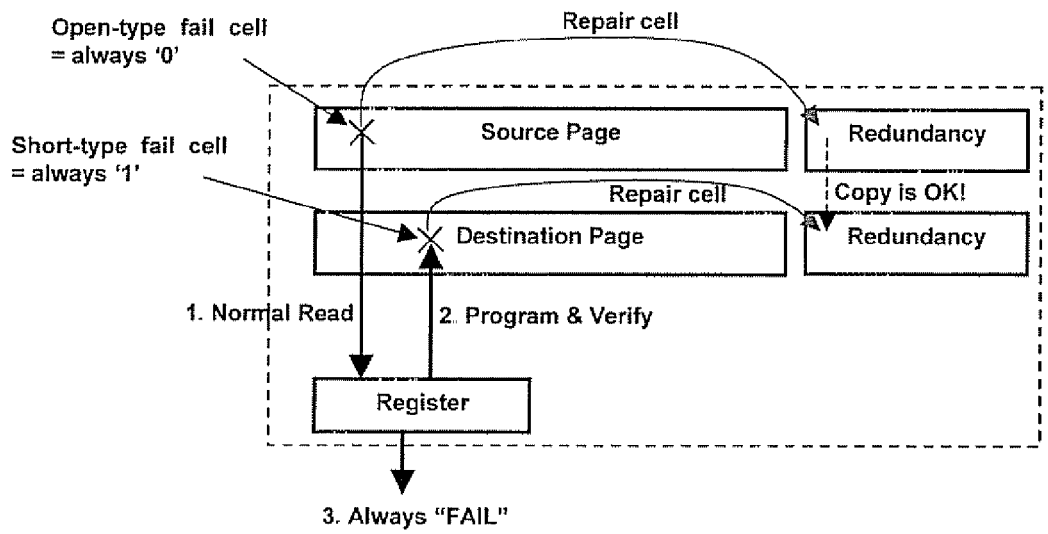
FIG. 8 illustrates schematically a Program Verify operation when a bitline in the source page and a bitline in a destination page have been substituted with a redundant bitline in accordance with the invention.

In the situation of FIG. 8, the Byte-by-byte Verify operation is successful if the destination redundancy cell is correctly programmed. This is because the defective cell of the destination page is not involved in this operation.

Figure 9:
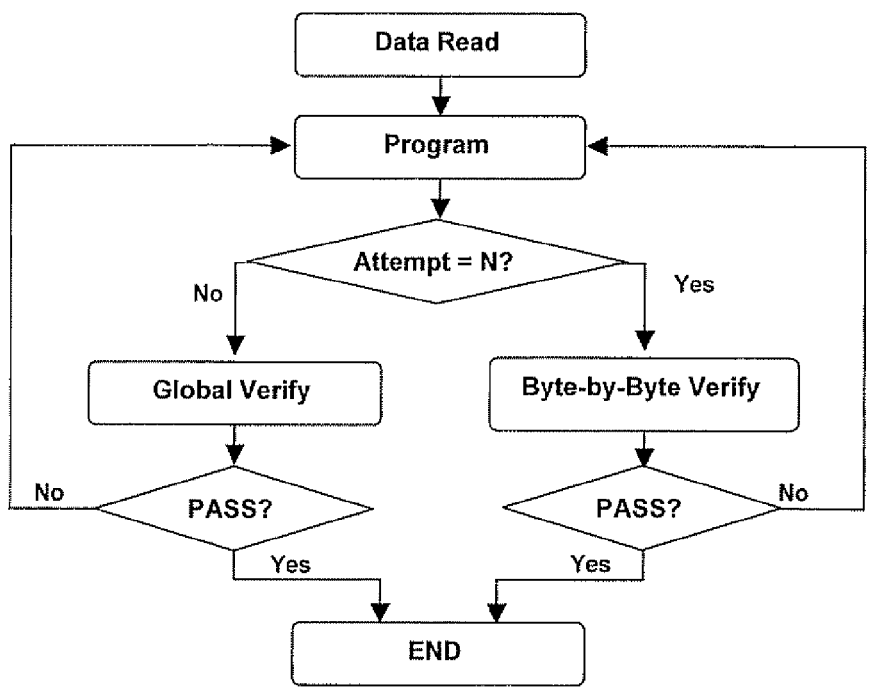
FIG. 9 is a flow chart of a method in accordance with the invention.

The method of the invention is schematically shown in the flow chart of FIG. 9. First, the destination cells are verified with the Global Verify operation using the nWDO signals. If this operation fails for N consecutive attempts, the situation of FIG. 8 is likely to have occurred and the Byte-by-byte Verify operation is carried out.

The number N is chosen to meet timing requirements of NAND memory devices For example, it is possible to switch from Global Verify to Byte-by-byte Verify operation after 5 consecutive attempts (N=5), then carrying out only Byte-by-byte Verify operations as long as the Copyback Program operation is correctly accomplished.

As an option, a maximum number Z of consecutive Byte-by-byte Verify operations may be contemplated, and a fail may be signaled when this last operation has been carried out Z consecutive times after having executed the Global Verify operation N times. All memory cells results have not yet been correctly programmed.

This method provides the following advantages:

1) Does not unduly prolong the Copyback Program operation for devices without defects, and is more precise than a traditional Global Verify operation while fully meeting restrictive timing specifications of NAND FLASH memory devices 2) Devices for which the situation illustrated in FIG. 8 takes place are recognized as correctly functioning devices without any test overhead, while present practices would be discarded.

3) The Byte-by-byte Verify operation in the context of a Copyback Program operation may be conveniently implemented by the same Erase-Verify circuitry that normally exists in all NAND memory devices Therefore, the method requires only a slight modification of the logic circuitry of the memory for counting the number of times the Global Verify operation is carried out and for commanding, if necessary, a Byte-by-byte verification.

4) The Copyback operation may be executed also from odd to even pages, or vice-versa.

That which is claimed:

1. A method for programming cells in a destination page in a nonvolatile memory, and verifying if logic values stored in programmed cells of a source page of the nonvolatile memory have been correctly copied into corresponding cells of the destination page, the method comprising carrying out a global verify operation by:
generating for each bitline of the destination page a respective bitline fail flag signaling if an unsuccessfully programmed cell is associated therewith;
generating a global fail flag for the entire destination page if at least one unsuccessfully programmed cell is in the destination page by logically combining the bitline fail flags;
if the global fail flag is generated, then reprogramming the at least one bitline corresponding to the at least one unsuccessfully programmed cell, and repeating the generating steps;
establishing a first maximum number of times the global verify operation is to be consecutively repeated;
if the global fail flag still signals an unsuccessfully programmed cell after the first maximum number of times the global verify operation has been performed, then carrying out a byte-by-byte verify operation for verifying that the bitlines of the destination page are programmed or their corresponding bitlines of a redundant bank of cells are programmed; and
if a bitline is coupled to at least one unsuccessfully programmed cell, then reprogramming the bitline and repeating the byte-by-byte verify operation.

2. The method according to claim 1, wherein the byte-by-byte verify operation comprises sequentially incrementing column addresses for verifying the programmed cells in the destination page.

3. The method according to claim 1, wherein the nonvolatile memory comprises a NAND FLASH memory.

4. The method according to claim 1, further comprising:
counting the number of times the global verify operation is consecutively repeated on a same destination page; and
if the counting reaches a second maximum number, then terminating the method and signaling an irreparable fail condition for the nonvolatile memory.

5. A method for programming cells in a destination page in a nonvolatile memory, and verifying if logic values stored in programmed cells of a source page of the nonvolatile memory have been correctly copied into corresponding cells of the destination page, the method comprising:
generating for each bitline of the destination page a respective bitline fail flag signaling if an unsuccessfully programmed cell is associated therewith;
generating a global fail flag for the destination page if at least one unsuccessfully programmed cell is in the destination page based upon the generated bitline fail flags;
if the global fail flag is generated, then reprogramming the at least one bitline corresponding to the at least one unsuccessfully programmed cell, and repeating the generating steps;
if the global fail flag still signals an unsuccessfully programmed cell after a first maximum number of times, then carrying out a byte-by-byte verify operation for verifying that the bitlines of the destination page are programmed or their corresponding bitlines of a redundant bank of cells are programmed.

6. The method according to claim 5, wherein if a bitline is coupled to at least one unsuccessfully programmed cell, then reprogramming the bitline and repeating the byte-by-byte verify operation.

7. The method according to claim 5, wherein the global fail flag is generated by logically combining the bitline fail flags.

8. The method according to claim 5, further comprising determining the first maximum number of times the global fail flag still signals an unsuccessfully programmed cell.

9. The method according to claim 5, wherein the byte-by-byte verify operation comprises sequentially incrementing column addresses for verifying the programmed cells in the destination page.

10. The method according to claim 5, wherein the nonvolatile memory comprises a NAND FLASH memory.

11. The method according to claim 5, further comprising:
counting the number of times the generating is consecutively repeated on a same destination page; and
if the counting reaches a second maximum number, then terminating the method and signaling an irreparable fail condition for the nonvolatile memory.

12. A NAND FLASH memory comprising:
a plurality of cells organized as pages;
a bank of redundancy cells associated with each page;
a plurality of bitlines coupled to said plurality of cells and to said bank of redundancy cells;
a first circuit for carrying out a global verify operation for verifying if logic values stored in programmed cells of a source page have been correctly copied into corresponding cells of a destination page, the global verify operation comprising
generating for each bitline of the destination page a respective bitline fail flag signaling if an unsuccessfully programmed cell is associated therewith,
generating a global fail flag for the entire destination page if at least one unsuccessfully programmed cell is in the destination page by logically combining the bitline fail flags,
if the global fail flag is generated, then reprogramming the at least one bitline corresponding
to the at least one unsuccessfully programmed cell,
and repeating the generating steps;
a logic circuit for counting a number of times the global verify operation is consecutively carried out, and when the counting reaches a first maximum number of times, then activating a byte-by-byte verify operation; and
an erase-verify circuit for carrying out the byte-by-byte verify operation for verifying that the bitlines of the destination page are programmed or their corresponding bitlines of a redundant bank of cells are programmed, and if a bitline contains at least one unsuccessfully programmed cell, then reprogramming the bitline and repeating the byte-by-byte verify operation.

13. The NAND FLASH memory according to claim 12, wherein the byte-by-byte verify operation comprises sequentially incrementing column addresses for verifying the programmed cells in the destination page.

14. The NAND FLASH memory according to claim 12, wherein said logic circuit counts the number of times the generating steps are consecutively repeated on a same destination page, and if the counting reaches a second maximum number, then terminating the verifying and signaling an irreparable fail condition for the WAND FLASH memory.

15. A nonvolatile memory comprising:
a plurality of cells organized as pages;
a bank of redundancy cells associated with each page;
a plurality of bitlines coupled to said plurality of cells and to said bank of redundancy cells;
a first circuit for carrying out a global verify operation for verifying if logic values stored in programmed cells of a source page have been correctly copied into corresponding cells of a destination page, the global verify operation comprising
generating for each bitline of the destination page a respective bitline fail flag signaling if an unsuccessfully programmed cell is associated therewith,
generating a global fail flag for the entire destination page if at least one unsuccessfully programmed cell is in the destination page,
if the global fail flag is generated, then reprogramming the at least one bitline corresponding to the at least one unsuccessfully programmed cell, and repeating the generating steps;
a logic circuit for counting a number of times the global verify operation is consecutively carried out, and when the counting reaches a first maximum number of times, then activating a byte-by-byte verify operation; and
an erase-verify circuit for carrying out the byte-by-byte verify operation for verifying that the bitlines of the destination page are programmed or their corresponding bitlines of a redundant bank of cells are programmed, and if a bitline contains at least one unsuccessfully programmed cell, then reprogramming the bitline and repeating the byte-by-byte verify operation.

16. The nonvolatile memory according to claim 15, wherein for said erase-verify circuit, if a bitline is coupled to at least one unsuccessfully programmed cell, then the bitline is reprogrammed and the byte-by-byte verify operation is repeated.

17. The nonvolatile memory according to claim 15, wherein said first circuit generates the global fail flag by logically combining the bitline fail flags.

18. The nonvolatile memory according to claim 15, wherein the byte-by-byte verify operation comprises sequentially incrementing column addresses for verifying the programmed cells in the destination page.

19. The nonvolatile memory according to claim 15, wherein said plurality of cells are configured so that the nonvolatile memory comprises a NAND FLASH memory.

20. The nonvolatile memory according to claim 15, wherein said logic circuit counts the number of times the generating is consecutively repeated on a same destination page, and if the counting reaches a second maximum number, then terminating the verifying and signaling an irreparable fail condition for the nonvolatile memory.

* * * * *

UNITED STATES PATENT AND TRADEMARK OFFICE
CERTIFICATE OF CORRECTION

PATENT NO. : 7,385,850 B2  
APPLICATION NO. : 11/539708  
DATED : June 10, 2008  
INVENTOR(S) : Jeong et al.

Page 1 of 1

It is certified that error appears in the above-identified patent and that said Letters Patent is hereby corrected as shown below:

Cover Page, Section 75     Delete: "Yongin"  
Insert: --Yongin-City--

Column 4, Lines 38-39     Delete: "specifications This"  
Insert: --specifications. This--

Column 6, Line 33     Delete: "parallel Thus"  
Insert: --parallel. Thus--

Column 7, Line 8     Delete: "devices Therefore"  
Insert: --devices. Therefore--

Column 9, Line 12     Delete: "WAND"  
Insert: --NAND--

Signed and Sealed this

Sixteenth Day of September, 2008

JON W. DUDAS  
*Director of the United States Patent and Trademark Office*